US010763644B2

(12) United States Patent
Caër et al.

(10) Patent No.: US 10,763,644 B2
(45) Date of Patent: *Sep. 1, 2020

(54) LATERAL CURRENT INJECTION ELECTRO-OPTICAL DEVICE WITH WELL-SEPARATED DOPED III-V LAYERS STRUCTURED AS PHOTONIC CRYSTALS

(71) Applicant: INTERNATIONAL BUSINESS MACHINES CORPORATION, Armonk, NY (US)

(72) Inventors: Charles Caër, Adliswil (CH); Lukas Czornomaz, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/572,122

(22) Filed: Sep. 16, 2019

(65) Prior Publication Data

US 2020/0083672 A1    Mar. 12, 2020

Related U.S. Application Data

(63) Continuation of application No. 15/691,912, filed on Aug. 31, 2017, now Pat. No. 10,594,111.

(51) Int. Cl.
*H01S 5/10* (2006.01)
*H01S 5/343* (2006.01)
(Continued)

(52) U.S. Cl.
CPC .......... *H01S 5/343* (2013.01); *H01S 5/0228* (2013.01); *H01S 5/02453* (2013.01);
(Continued)

(58) Field of Classification Search
CPC ...... H01S 5/343; H01S 5/0228; H01S 5/3054; H01S 5/02453; H01S 5/105
See application file for complete search history.

(56) References Cited

U.S. PATENT DOCUMENTS 7,492,979 B2    2/2009    Wang
7,643,710 B1    1/2010    Liu
(Continued)

OTHER PUBLICATIONS

Caer, et al., "Lateral Current Injection Electro-Optical Device With Well-Separated Doped III-V Layers Structured As Photonic Crystals", U.S. Appl. No. 16/572,447, filed Sep. 16, 2019.
(Continued)

*Primary Examiner* — Tod T Van Roy
*Assistant Examiner* — Delma R Fordé
(74) *Attorney, Agent, or Firm* — Michael A. Petrocelli

(57) ABSTRACT

A lateral current injection electro-optical device includes a slab having a pair of structured, doped layers of III-V semiconductor materials arranged side-by-side in the slab, the pair including an n-doped layer and a p-doped layer, each of the p-doped layer and the n-doped layer includes a two-dimensional photonic crystal, and a separation section extending between the pair of structured layers, the separation section separates the pair of structured layers, the separation section includes current blocking trenches, and an active region of III-V semiconductor gain materials between the current blocking trenches that form a photonic crystal cavity.

10 Claims, 5 Drawing Sheets

(51) Int. Cl.
*H01S 5/30* (2006.01)
*H01S 5/022* (2006.01)
*H01S 5/024* (2006.01)
*H01S 5/042* (2006.01)
*H01S 5/02* (2006.01)
*H01S 5/026* (2006.01)
*H01S 5/50* (2006.01)

(52) U.S. Cl.
CPC .......... *H01S 5/0424* (2013.01); *H01S 5/105* (2013.01); *H01S 5/3054* (2013.01); *H01S 5/021* (2013.01); *H01S 5/026* (2013.01); *H01S 5/1017* (2013.01); *H01S 5/50* (2013.01)

(56) References Cited

U.S. PATENT DOCUMENTS

| | | | |
|---|---|---|---|
| 7,813,401 | B2 | 10/2010 | Scherer |
| 8,462,827 | B2 | 6/2013 | Matsuo |
| 8,471,352 | B2 | 6/2013 | Ellis |
| 8,787,417 | B2 * | 7/2014 | Baets ............ B82Y 20/00 372/45.01 |
| 8,929,415 | B2 | 1/2015 | Kim |
| 9,316,785 | B2 | 4/2016 | Krasulick |
| 9,625,665 | B2 | 4/2017 | Pinguet |
| 9,778,426 | B2 | 10/2017 | Shaw |
| 10,256,603 | B2 | 4/2019 | Caër |
| 10,340,661 | B2 * | 7/2019 | Caer ............ H01S 5/343 |
| 2003/0007719 | A1 * | 1/2003 | Forrest .......... B82Y 20/00 385/14 |
| 2008/0002931 | A1 | 1/2008 | Noda |
| 2013/0092897 | A1 | 4/2013 | Shambat |
| 2015/0222092 | A1 | 8/2015 | Kim |
| 2016/0252692 | A1 * | 9/2016 | Hofrichter ....... H01S 5/0014 250/227.11 |
| 2017/0153879 | A1 | 6/2017 | George |
| 2018/0241176 | A1 | 8/2018 | Abel |
| 2019/0067911 | A1 | 2/2019 | Caër |

OTHER PUBLICATIONS

Ellis et al., "Ultralow-threshold electrically pumped quantum-dot photonic-crystal nanocavity laser", Nature Photonics Letter, Nature Photonics 5, 297-300, (2011), Abstract, Published online Apr. 24, 2011, 11 pages.

Inoue et al., "Room-temperature continuous-wave operation of GaInAsP/InP lateral-current-injection membrane laser bonded on Si substrate", IOPscience, Applied Physics Express, vol. 7, No. 7, Published Jun. 25, 2014, Abstract, 3 pages.

List of IBM Patents or Patent Applications Treated as Related. Filed Herewith. 2 pages.

Matsuo et al., "20-Gbit/s directly modulated photonic crystal nanocavity laser with ultra-low power consumption", Abstract, © 2011 Optical Society of America, Jan. 31, 2011/ vol. 19, No. 3 / Optics Express, 9 pages.

Shambat, et al. "Electrically driven Photonic Crystal Nanocavity Devices" IEEE Journal of Selected Topics in Quantum Electronics, vol. 18, No. 6, Nov./Dec. 2012, pp. 1700-1710.

Shindo et al., "GaInAsP/InP lateral-current-injection distributed feedback laser with a-Si surface grating", Abstract, © 2011 Optical Society of America, Jan. 31, 2011 /vol. 19, No. 3, / Optics Express, 8 pages.

Takahashi et al., "High-Q nanocavity with a 2-ns photon lifetime", © 2007 Optical Society of America, Abstract, Dec. 10, 2007 / vol. 15, No. 25 / Optics Express, 8 pages.

Takeda et al., "Few-fJ/bit data transmissions using directly modulated lambda-scale embedded active region photonic-crystal lasers", Nature Photonics | Article, Nature Photonics 7, 569-575 (2013), Accepted Apr. 8, 2013, Published online May 26, 2013, 5 pages.

Takeda et al., "Heterogeneously integrated photonic-crystal lasers on silicon for on/off chip optical interconnects", © 2015 Optical Society of America, Dec. 29, 2014 | vol. 22, No. 26 | DOI:10.1364/OE.22.0702 | Optics Express 702, 7 pages.

Takeda et al., "Photonic-crystal lasers on silicon for chip-scale optical interconnects", Proc. SPIE 9767, Novel In-Plane Semiconductor Lasers XV, 976710 (Mar. 7, 2016), Abstract, 3 pages, SPIE.Digital Library.

* cited by examiner

LATERAL CURRENT INJECTION ELECTRO-OPTICAL DEVICE WITH WELL-SEPARATED DOPED III-V LAYERS STRUCTURED AS PHOTONIC CRYSTALS

BACKGROUND

The present invention generally relates to semiconductor devices, and more particularly to lateral current injection electro-optical devices and silicon photonic chips including such devices.

The integration of III-V semiconductor gain materials (e.g., for light sources emitting at datacom and/or telecom wavelengths) in silicon photonics platforms may allow obtaining high bandwidth optical interconnects. For example, an III-V, lateral current injection (LCI) laser source is particularly attractive, due to the small threshold current and footprint it involves and the integration possibilities it offers. The thinner stack height of LCI lasers may enable their integration in smaller nodes, unlike their vertical current injection counterparts. Specifically, several types of III-V stacks (for laser, detection or amplification purposes) may be integrated in photonics platforms.

SUMMARY

According to a first aspect, the present invention is embodied as a lateral current injection electro-optical device. The device includes a slab, which has a pair of structured, doped layers of III-V semiconductor materials, arranged side-by-side in the slab. The pair includes an n-doped layer (i.e., a doped n-type material) and a p-doped layer (i.e., a doped p-type material). The slab further includes a separation section, which extends between the pair of structured layers so as to fully separate them. Each of the p-doped layer and the n-doped layer is configured as a two-dimensional photonic crystal. The separation section includes current blocking trenches. An active region of III-V semiconductor gain materials is arranged between the current blocking trenches, so as to form, together with the pair of structured, doped layers of III-V semiconductor materials, a photonic crystal cavity.

The above design allows the lateral current injection device to be directly embedded in a silicon photonic chip back-end of the line. Selective regrowth, for instance, may be used to ensure a clean separation of the doped layers, by the active region and the trenches, so as to avoid unwanted recombination and leakage paths.

In various embodiments, the electro-optical device may include one or more of the following (optional) features:

Each of the p-doped layer and the n-doped layer may include a crystal lattice defect about the active region, which defect is designed to cause, together with the separation section, an optical mode within the photonic frequency bandgap of the photonic crystal cavity (the photonic crystal cavity has a cavity frequency within this photonic frequency bandgap). Such a defect may be exploited to increase the efficiency of the cavity;

Each of the p-doped layer and the n-doped layer may, for instance, include a lattice of holes, including a modulated subset of holes, so as to form said crystal lattice defect;

A width of the separation section, as measured in an average plane of the slab, between the p-doped layer and the n-doped layer, corresponds to an average distance between two holes in the lattice of any of the p-doped layer and the n-doped layer;

The lattice of holes includes a hexagonal lattice;

The n-doped layer is further structured so as to form an output waveguide core for out-coupling optical radiation from the slab. The fact that the cavity be coupled to an integrated waveguide may allow an efficient extraction and coupling to a silicon waveguide (e.g., structured from a silicon on insulator wafer that is preferably bonded onto the present device, as discussed below);

An extraction portion of the output waveguide core may, for instance, easily be formed as a line defect in the lattice of holes of the n-doped layer, whereby one or more rows of holes are missing at the level of said line defect;

The output waveguide core may include a tapered portion, protruding from an edge of the n-doped layer and extending parallel to the extraction portion, for out-coupling radiation to an external waveguide core;

The n-doped layer may include an edge crystal lattice defect about said edge of the n-doped layer, the edge crystal lattice defect designed so as to lower back-reflection of radiation out-coupled through said output waveguide core;

The electro-optical device is configured as a lateral current injection, edge-emitting laser device;

The stack of III-V semiconductor gain materials may include one of: $In_{1-x-y}Al_xGa_yAs$; $In_{1-x}Ga_xAs_yP_{1-y}$; and $In_{1-x}Ga_xAs_yNi_{1-y}$, with $0 \le x \le 1$ and $0 \le y \le 1-x$; and each of the p-doped layer and the n-doped layer may include one of InP, InAs or GaAs; and Each of the p-doped layer and the n-doped layer is a selectively regrown layer.

According to another aspect, the invention is embodied as a silicon photonic chip. The silicon photonic chip may include a lateral current injection, electro-optical device such as described above, as well as a silicon on insulator wafer, the electro-optical device arranged on the silicon on insulator wafer.

In such embodiments, the silicon photonic chip may include one or more of the following (optional) features:

The n-doped layer is further structured so as to form an output waveguide core for out-coupling optical radiation from the slab. The output waveguide core may include a tapered portion, protruding from an edge of the n-doped layer. This tapered portion is opposite a reversely tapered portion of a silicon waveguide core formed in a top silicon layer of the silicon on insulator wafer;

The silicon photonic chip is a CMOS-fabricated device, which includes CMOS-compatible metal contacts extending opposite to the silicon on insulator wafer with respect to the slab, the metal contacts contacting the n-doped layer and the p-doped layer;

The silicon photonic chip further includes a CMOS-compatible metal heater arranged in thermal communication with the active region of III-V semiconductor gain materials;

The electro-optical device is a CMOS-fabricated device, embedded in a back-end-of-the-line of the silicon photonic chip;

The electro-optical device is co-integrated, in the back-end-of-the-line of the silicon photonic chip, with one or more CMOS-fabricated integrated circuits; and Said CMOS-fabricated integrated circuits may include transistors configured for driving said electro-optical device.

According to a final aspect, the invention is embodied as a method of fabrication of an electro-optical device as in embodiments. In this method, the pair of structured, doped layers of III-V semiconductor materials is obtained by selective regrowth, e.g., so as to allow a clean separation between the n-doped and p-doped regions.

BRIEF DESCRIPTION OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
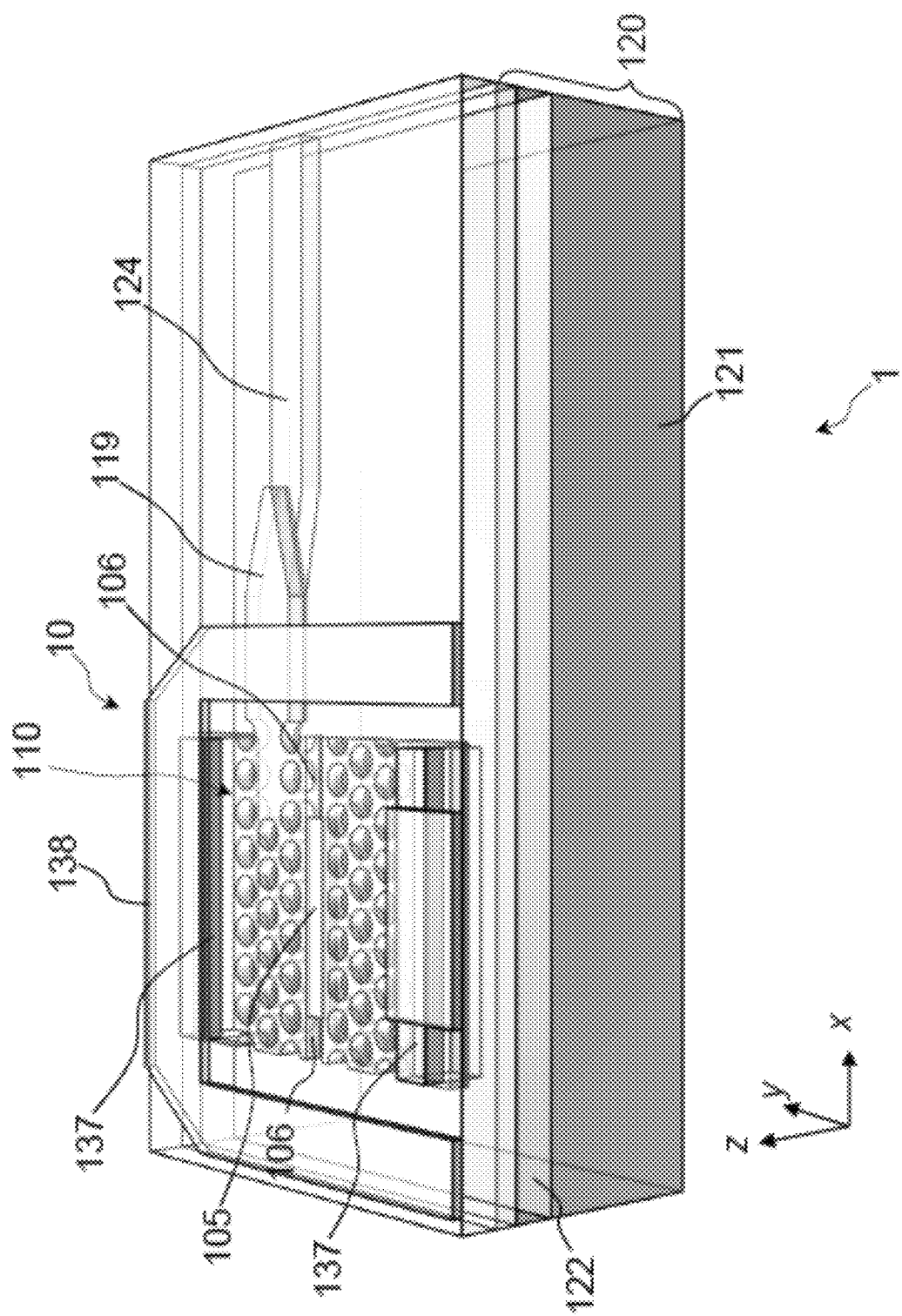
FIG. 1 is a 3D view of a silicon photonic chip that includes an electro-optical device, according to an embodiment of the present disclosure.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Numerous studies have been conducted with the aim of achieving satisfactory integration of small electro-optical devices in III-V-based silicon photonics platforms for the purpose of obtaining low-power, on-chip optical interconnects.

III-V laser sources are based on photonic crystal cavities and exhibit a small threshold current and footprint. III-V laser sources may be embedded in a CMOS chip during back-end-of-the-line processes, enabling co-integration with CMOS integrated circuits. In addition, their ability to perform material regrowth around the active region offers opportunities to further enhance the current injection in such lasers, making them attractive for high-speed and low power applications.

However, the integration of an electro-optical device (e.g., such as a laser source) in a silicon photonics platform may pose several challenges for optical and data communications. More specifically, the following requirements need to be satisfied for the successful integration of electro-optical devices in silicon photonics platforms:

Very low threshold current,

Minimized resistances and capacitances for enabling high speed drive,

Low footprint and large-scale integration,

Efficient extraction and coupling to passive silicon waveguides,

Tunability of the lasing wavelength (actively or by design), if applicable,

Low self-heating and temperature stability,

High free spectral range for wavelength-division multiplexing (WDM), and

Full integration in back-end-of-the-line of a CMOS chip.

Embodiments of the present disclosure provides a lateral current injection electro-optical device designed (based on photonic crystal cavities) to address one or more of the above requirements Lateral current injection electro-optical devices may include edge-emitting laser devices, optical detectors and semiconductor optical amplifiers. In particular, embodiments of the present disclosure may provide a device including a slab with a pairs of doped layers of III-V semiconductors, structured as photonic crystals. In exemplary embodiments, the device may allow an electrically pumped photonic crystal cavity laser to be embedded in the silicon photonic chip back-end-of-the-line region.

The present invention generally relates to semiconductor devices, and more particularly to lateral current injection electro-optical devices and silicon photonic chips including such devices.

Referring now to FIGS. 1-4, a lateral current injection electro-optical device 10 (hereinafter "electro-optical device") is shown, according to an embodiment of the present disclosure.

The electro-optical device 10 may include a slab 110, which may include a pair of structured doped layers of III-V semiconductor materials. This pair includes an n-doped layer 112 and a p-doped layer 114. The n-doped layer 112 and the p-doped layer 114 are arranged side-by-side in the slab 110. That is, the n-doped layer 112 and the p-doped layer 114 are arranged oppositely in the slab, in essentially the same way as two tiles having a common edge. Specifically, each of the n-doped layer 112 and the p-doped layer 114 essentially fills one half of the slab 110 as shown in the figures.

Each of the p-doped layer 114 and the n-doped layer 112 is configured as a two-dimensional photonic crystal. I.e., each of the n-doped layer 112 and the p-doped layer 114 is structured as a 2D periodic optical nanostructure, so as to impact the motion of photons. An example of 2D periodic optical nanostructure lattice is shown in FIGS. 2 and 3.

Next, the slab may include a thin separation section 113, which extends between the n-doped layer 112 and the p-doped layer 114 so as to fully separate them. The separation section 113 may include current blocking trenches 106, as well as an active region 105 of III-V semiconductor gain materials. The active region 105 typically includes a stack of III-V gain materials, i.e., materials from the group of III-V compound semiconductors that provide the gain medium, so as to achieve optical amplification of radiations of interest, as known per se. As assumed in the accompanying drawings, the III-V materials of the active region 105 are stacked along a stacking direction z that is perpendicular to a main plane of the stack.

Figure 2:
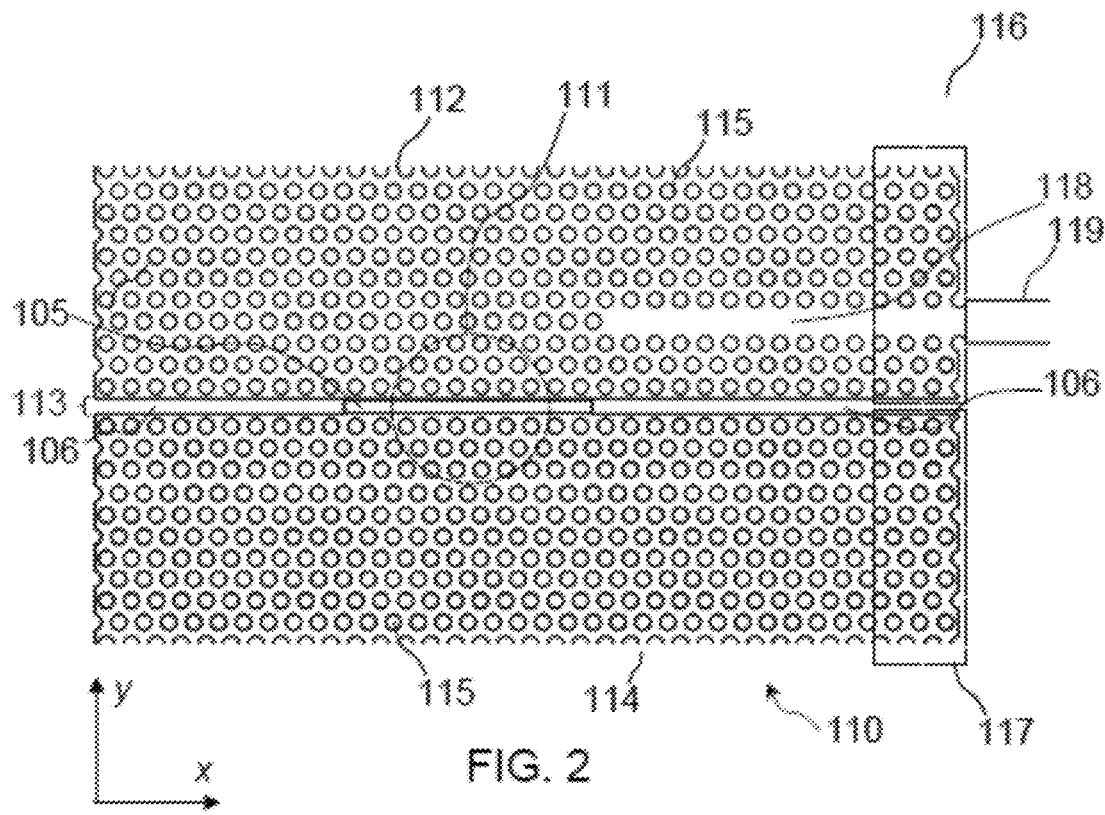
FIG. 2 shows a top view of a slab of an electro-optical device as in FIG. 1, where each doped (contact) layer of III-V materials is configured as a 2D photonic crystal and arranged side-by-side in the slab. A separation section extends between the doped layers so as to fully separate them. This section includes current blocking trenches and an active region of III-V gain materials in-between, so as to form a photonic crystal cavity, according to an embodiment of the present disclosure.
Figure 3:
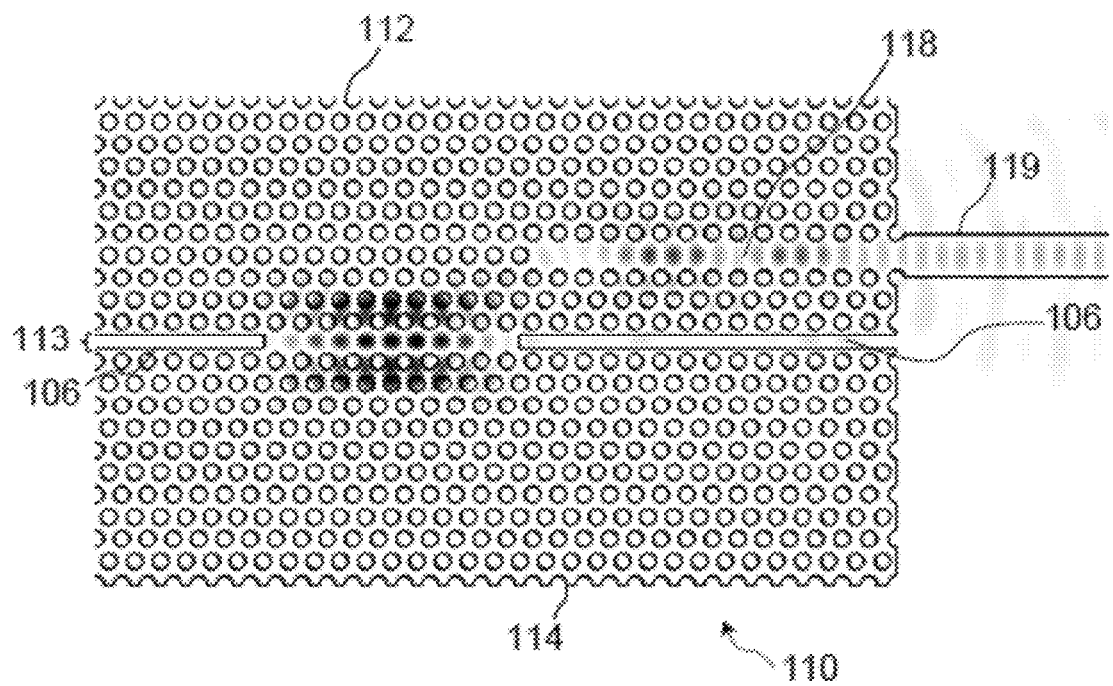
FIG. 3 shows a simulated density plot of a horizontal component (Ey) of the electric field (in absolute value), for a TE polarized optical mode of a photonic crystal cavity obtained with an III-V slab as in FIG. 2, according to an embodiment of the present disclosure.

The active region 105 is arranged between the current blocking trenches 106, as seen in FIGS. 1-3, so as to make up the separation section 113, which separate the n-doped layer 112 and the p-doped layer 114. As such, photonic crystal-like n-doped and p-doped layers 112, 114 together with the separation section 113 may form a photonic crystal cavity. The width of the separation section 113 typically corresponds to the pitch of the lattice, i.e., the center-to-center distance between two contiguous nanostructures subtending the lattice.

Figure 5:
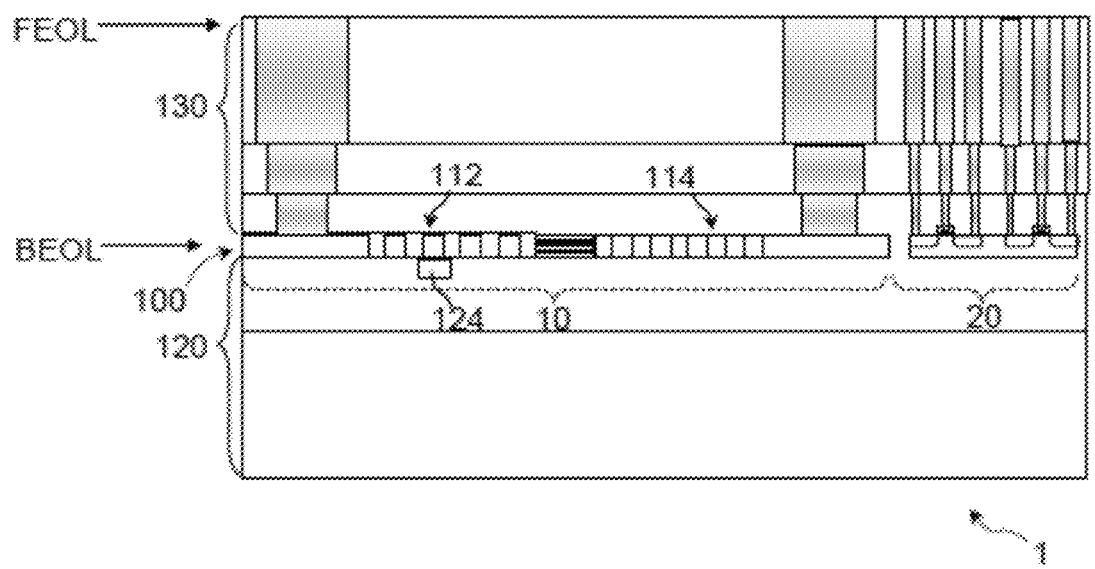
FIG. 5 shows a 2D cross-sectional view of another silicon photonic chip, where the electro-optical device is co-integrated with other circuit elements, according to an embodiment of the present disclosure.
Figure 6A:
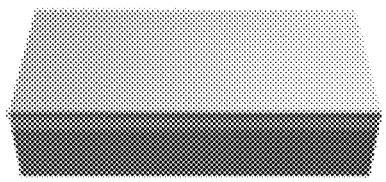
FIGS. 6A-6J depict a sequence illustrating high-level fabrication steps of an electro-optical device, according to an embodiment of the present disclosure.
Figure 6B:
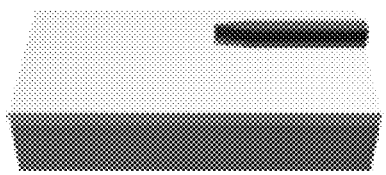
Figure 6C:
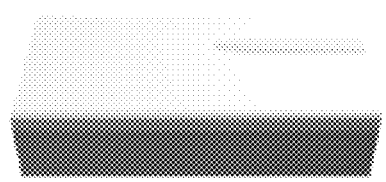
Figure 6D:
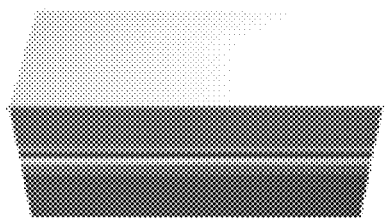
Figure 6E:
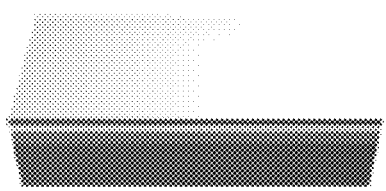
Figure 6F:
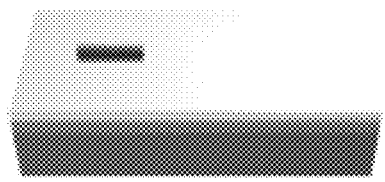
Figure 6G:
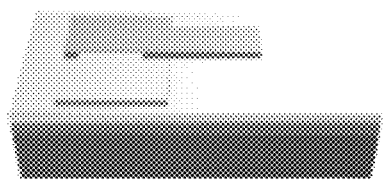
Figure 6H:
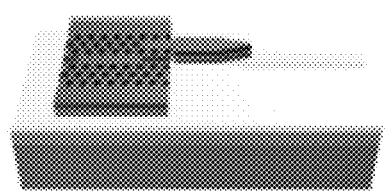
Figure 6I:
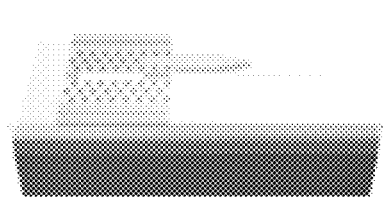
Figure 6J:
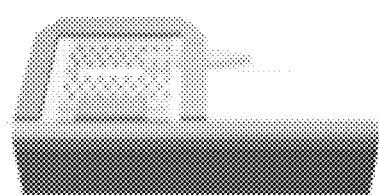

The lateral current injection scheme used here may enable low threshold current and ultrafast direct modulation. The proposed electro-optical device design may ease its integration. Namely, it may allow the electro-optical device 10 to be directly embedded in the back-end-of-the-line region of a silicon photonic chip 1, as illustrated in FIG. 5. The slab 110 is fabricated so as to ensure a clean separation between the n-doped layer 112 and the p-doped layer 114, thanks to the separation section 113 (which includes the active region 105). I.e., there is a full separation between the n- and p-doped regions, which excludes any short between the two halves. Thus, the resulting design may allow suppressing (at least substantially, if not entirely) unwanted recombination and leakage paths. The current blocking trenches 106 on each side of the cavity force carrier recombination within the cavity.

To that aim, a selective regrowth of the n-doped layer 112 and the p-doped layer 114 may be relied on during fabrication. I.e., the n-doped layer 112 and the p-doped layer 114 may be achieved by selective regrowth, which further enables the regrowth of n+ and p+ regions, ensuring ohmic contact with the metal electrodes. As such, it may be possible to increase doping levels and enhance carrier injection, as further discussed below.

The stack of III-V semiconductor gain materials may include compounds such as, for instance, $In_{1-x-y}Al_xGa_yAs$, $In_{1-x}Ga_xAs_yP_{1-y}$, and $In_{1-x}Ga_xAs_yNi_{1-y}$, with $0 \leq x \leq 1$ and $0 \leq y \leq 1-x$. For example, the active region 105 may include InAs quantum dots or InAlGaAs quantum wells. The III-V stack forming the active region 105 may notably be configured as a multiple quantum well (MQW) section, sandwiched between other III-V materials, e.g. InP, or GaAs. Meanwhile, each of the p-doped layer 114 and the n-doped layer 112 may typically include InP, InAs or GaAs, as further discussed below.

The electro-optical device described above is preferably embodied as a lateral current injection, edge-emitting laser device. More generally, this device may be configured as an optical detector or a semiconductor optical amplifier (SOA). Thus, in general, the III-V active region 105 may be designed so as to be capable of producing, detecting or amplifying radiation in a given range of wavelengths and, in particular, at a given, average radiation wavelength. The wavelength range of interest is in the optical range i.e., 100 nm-1 mm, according to DIN 5031. Thus, the terminology "radiation" as used herein refers to electromagnetic radiation in the wavelength range between 100 nm and 1 mm. However, the wavelength range may, in most applications as contemplated herein, be between 200 nm and 7.5 μm. In particular, wavelengths of 1.3 and 1.55 μm are typically contemplated (and possibly 980 nm), for datacom and telecom applications.

The n-doped and p-doped layers 112, 114 may preferably include a hexagonal lattice configured to enable a photonic bandgap for TE polarization. Although not visible in FIGS. 2, 3, each of the p-doped layer 114 and the n-doped layer 112 preferably involve a crystal lattice defect 111 about the active region 105. This defect is designed to cause, together with the separation section 113, an optical mode within the photonic frequency bandgap of the photonic crystal cavity. The photonic crystal cavity is assumed to be designed so as to have a cavity frequency within the photonic frequency bandgap. The cavity wavelength is determined by the period and filling factor of the p-doped layer 114 and the n-doped layer 112 (e.g., photonic crystal layers).

In an embodiment, a lattice defect-free cavity may be contemplated. In that case, the sole defect would be provided by the interruption caused by the separation section 113. However, the cavity performance would most probably be poorer in that case, compared to performance that may be achieved with additional crystal lattice defects.

In the embodiments depicted in FIGS. 1-3, the nanostructures forming the photonic crystal lattices are assumed to be holes 115. That is, each of the p-doped layer 114 and the n-doped layer 112 includes a lattice of holes 115. Preferably, the two lattices of the p-doped layer 114 and the n-doped layer 112 may include, on each side of the separation section 113, a modulated subset of holes. I.e., characteristics of a subset of the holes 115 are modulated about the active region 105, so as to achieve the desired crystal lattice defect 111. Such modulations are typically on the order of 1% of the pitch (or less).

Figure 7A:
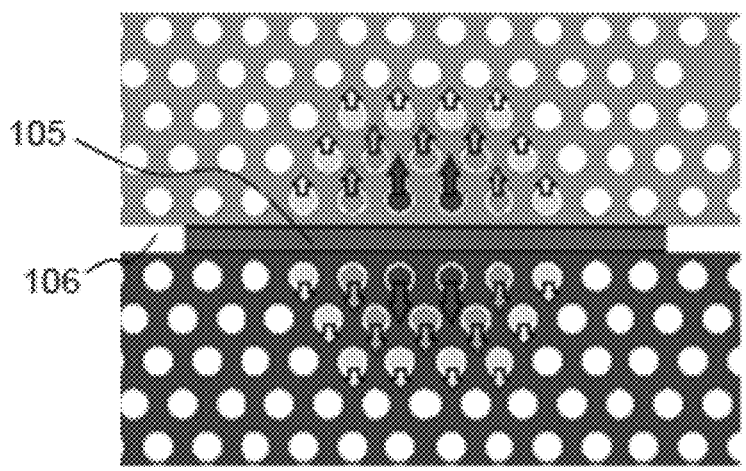
FIGS. 7A-7C illustrate possible modulations of 2D photonic crystals of an electro-optical device similar to that of FIGS. 2 and 3, according to an embodiment of the present disclosure.
Figure 7B:
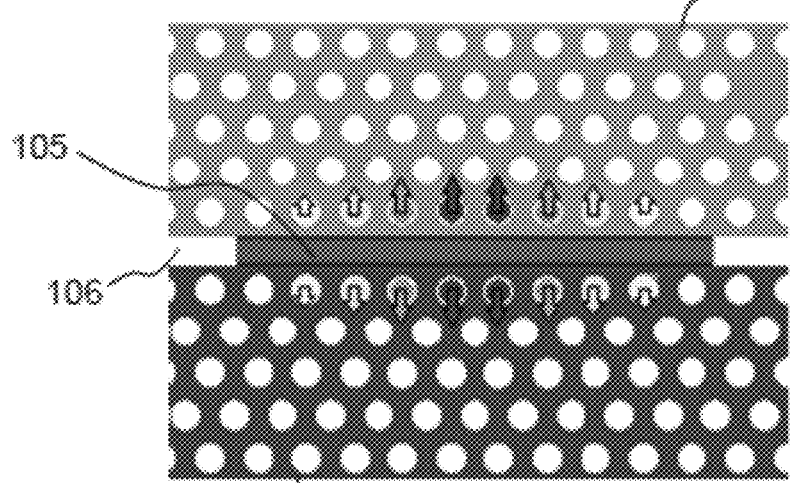
Figure 7C:
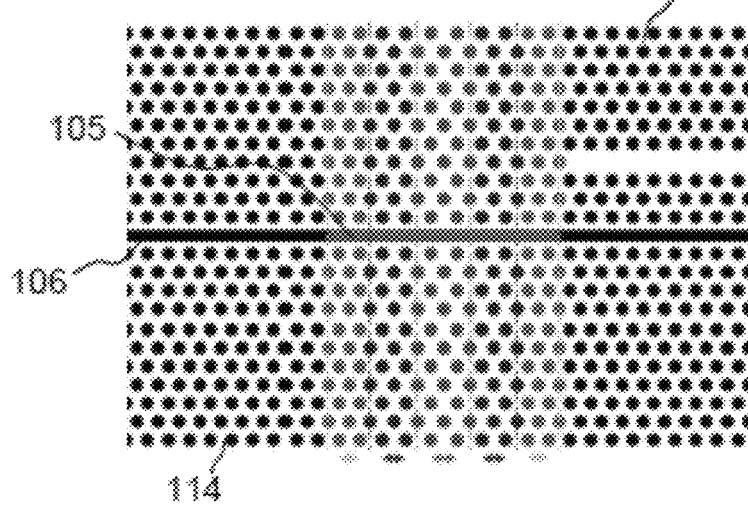

That is, holes about the active region 105 may be dimensioned and/or spaced from each other in order to create said defect. For example, the lattice constant may be in the 300-350 nm range for emission at 1300 nm, and in the 400-450 nm range for emission at 1550 nm. In such cases, the modulation may typically be in the order of 3-30 nm, e.g., with a ratio 1-⅔-⅓ from the center of the cavity toward the outer areas. Such modulations may not be visible at the scale of FIGS. 2 and 3. In the above example, a "ratio 1-⅔-⅓" means that, if the four central holes (i.e., the four darker holes at the center of the cavity in FIG. 7A, including two holes on each side of the active region 105) are shifted, outwardly, by 15 nm along the y direction, then the ten next holes may be similarly shifted by 10 nm and the 16 next holes (i.e., the lighter, non-white holes) are shifted by 5 nm. As further illustrated in FIG. 7A, only those holes in the six innermost layers (the three innermost layers on each side of the active region) are shifted to form the optical cavity. Yet, other modulations may be contemplated. In particular, holes may be shifted in the innermost two layers only, in which case the modulation ratio may be of 1-½. In the example of FIG. 7B, the modulation is slightly different: only the holes in the two innermost rows (the first row on each side of the active region) are shifted along axis y. The corresponding modulation is assumed to be 1-¾-½-¼ in this example. In fact, a modulation could be achieved by shifting just two holes (on one side of the line-defect), or four holes, and up to, e.g., a dozen of holes with a gradual pitch (for example, an increment of 1 nm). There are multiple options, which may impact the quality factor of the resonator. In other embodiments, modulations may occur along the horizontal direction, as in FIG. 7C. In this example, the lattice pitch is slightly stretched in the innermost columns. It should be noted that many variants to the above examples of modulations may be contemplated. In various embodiments, the width of the separation section 113 between the p-doped layer 114 and the n-doped layer 112 corresponds to distance (along axis y) between two rows (which corresponds, for a hexagonal lattice, to the first-neighbor distance×√3), minus the diameter of a hole. Typically, this may result in a width that is substantially equal to (though slightly less than) the first-neighbor distance between holes, i.e., the unperturbed distance between two holes in the lattices of the p-doped layer 114 and the n-doped layer 112. This width is measured parallel to the average plane of the slab 110, i.e., parallel to (x, y). In variants, this width may substantially correspond to, e.g., twice the pitch (or more).

As shown in FIGS. 1-3, the n-doped layer 112 may further be structured in a way such that an output waveguide core 118, 119 may be formed in order to out-couple optical radiation directly from the n-doped layer 112 of the slab 110. Appropriate cladding layers 122, 125, 135 (of lower refractive index) may be provided, which come in intimate contact with core materials (of higher refractive index). Yet, the output waveguide core 118, 119 may, in fact, be used to couple radiation into the active region 105 and/or from the stack.

Preferably, an extraction portion of the output waveguide core 118, 119 is formed as a line defect, directly in the lattice of the n-doped layer 112. As can be seen in FIG. 2 or 3, the line defect may be obtained as a single missing row of holes. Using a single missing row may allow single-mode propagation. In variants, several missing rows of holes may be relied on to form the line defect.

As depicted in FIG. 1, the output waveguide core 118, 119 may, in some embodiments, further include a tapered portion (not visible in FIG. 2 or 3), so as to favor optical coupling to/from the stack, as will be discussed in detail below. The tapered portion protrudes from an edge of the n-doped layer 112 and extends parallel to the inner, extraction portion of the output waveguide core 118. That is, the outer portion protrudes outwardly, in line with the inner portion. As further seen in FIG. 1, the taper of the portion 119 thins down, outwardly.

Referring back to FIGS. 2, 3, in some embodiments, the present electro-optical devices 10 further comprise an edge crystal lattice defect. For instance, the n-doped layer 112 may include an edge crystal lattice defect 116 about the edge supporting the outer portion 119 of the output waveguide core. This edge crystal lattice defect may be designed to lower back-reflection of radiation coupled through the output waveguide core 118, 119. In fact, each of the n-doped layer 112 and the p-doped layer 114 may involve a similar edge crystal lattice defect 116, 117, as assumed in FIGS. 2, 3. Again, the edge defects are not visible at the scale of FIGS. 2, 3.

In edge defects as contemplated herein, the lattice constant may for instance be stretched (typically by a few nanometers) along the propagation direction x, to increase the group velocity and change the mode profile to make it match the mode of the strip waveguide. As an example, if the lattice constant in the central area is 330 nm, then the lattice constant may be stretched to 340 nm over two periods, and to 350 nm over the next two periods, while the distance between the rows is kept constant (i.e., 330 nm×√3/2). Several options may be contemplated for edge modulations, as one skilled in the art may appreciate.

Referring now to FIGS. 1, 3, 4, and 5, a silicon (Si) photonic chip 1 may be described, according to an embodiment of the present disclosure. The silicon photonic chip 1 may include a lateral current injection, electro-optical device 10 such as described above in reference to FIGS. 1-4. In addition, the silicon photonic chip 1 may include a silicon-on-insulator (SOI) wafer 120. The electro-optical device 10 is arranged on the SOI for electromagnetic coupling purposes (whereby silicon is used as an optical medium).

In such embodiments, and as indicated before, the n-doped layer 112 of the electro-optical device 10 may preferably be structured to form an integrated output waveguide core 118, 119, which may include a tapered portion 119 protruding from an edge of the n-doped layer 112 and thinning down outwardly. As illustrated in FIG. 1, the tapered portion 119 is arranged opposite a reversely tapered portion of a Si waveguide core 124 of the SOI wafer 120, to favor optical coupling to/from the stack of the active region 105 from/to this Si waveguide core.

In FIG. 1, the Si waveguide core 124 may be formed from the top silicon layer of the SOI wafer 120 by known methods. Additional Si components may for instance be present (not shown), which may be structured from that same top Si layer. Also, the Si waveguide core 124 may further be structured (not shown) to include one or more (e.g., two) Distributed Bragg reflectors (DBR) or other optical structures, as necessary for the desired coupling.

In all cases, the structure may allow radiation to be optically coupled between the active region 105 (via the n-doped layer 112 and its integrated output waveguide core 118, 119) and the Si waveguide core 124 underneath the n-doped layer 112. This is illustrated by finite difference time domain simulations in FIG. 3. Depending on the application sought, the optical coupling may be bidirectional (reciprocal), i.e., occur from the active region 105 to the Si waveguide core 124 or, conversely, from the Si waveguide core 124 to the n-doped layer 112, in operation of the silicon photonic chip 1 and electro-optical device 10.

The optical coupling is ideally adiabatic. I.e., the Si waveguide core 124 is preferably configured so as to enable adiabatic coupling with the n-doped layer 112, whence the reverse tapers, as visible in FIG. 1. Adiabatic optical coupling is well known in the art. Adiabaticity condition is met when the optical distribution is defined by the same eigenmode i.e., supermode of the coupled system throughout the contact, with minimal scattering to other supermodes or radiation modes. Adiabaticity, however, is a relative term, as known; a coupler is considered to be adiabatic when the optical loss is below a predefined level, e.g. less than 15%, but typically less than 10%. Tapered portions of the opposite waveguide cores 119, 124 may in all cases be designed to optimize the optical coupling. The length of the taper portions may, for instance, typically be between 10 μm and 10 mm, which range of lengths allow for exceeding adiabaticity limits, in practice.

Figure 4:
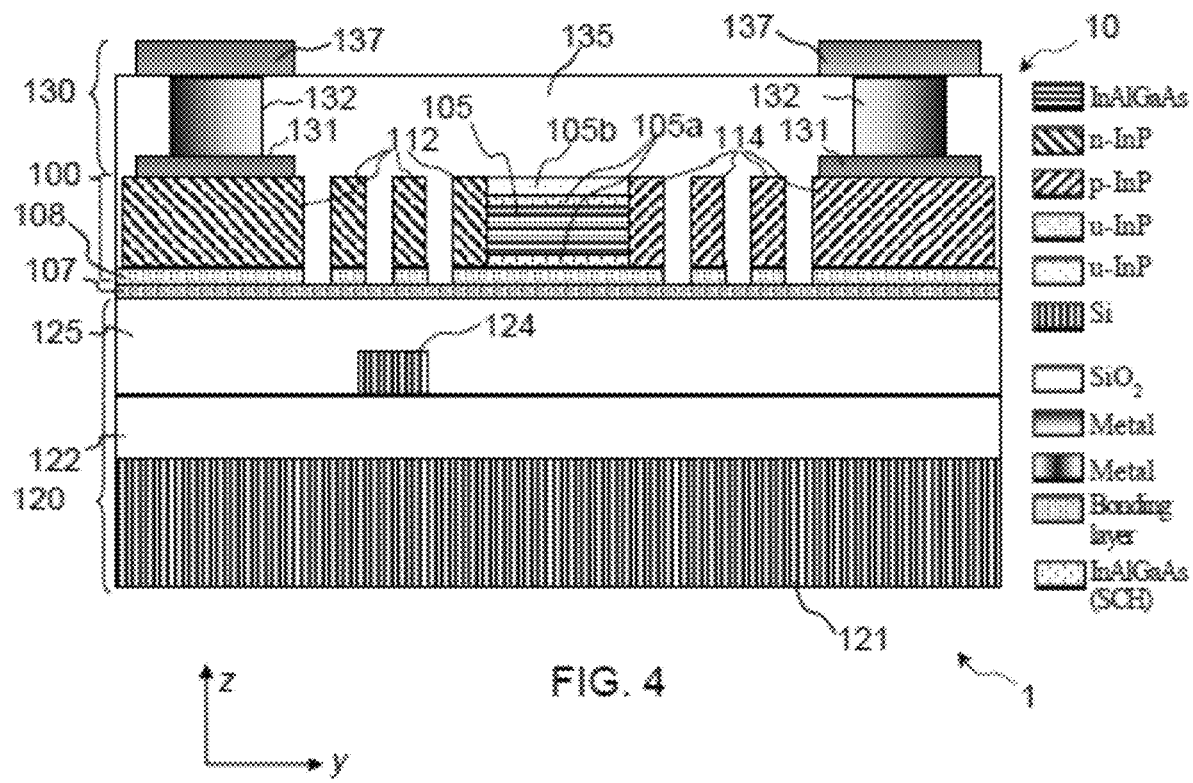
FIG. 4 is a 2D cross-sectional view of a silicon photonic chip that includes an electro-optical device, according to an embodiment of the present disclosure.

Preferably, the silicon photonic chip 1 is a CMOS-fabricated device, which may therefore include CMOS-compatible metal contacts 137 (hereinafter "metal contacts"). As seen in FIGS. 1, 4 and 5, the metal contacts 137 extend opposite to the SOI wafer 120 with respect to the slab 110. Metal contacts 137 contact the n-doped layer 112 and the p-doped layer 114, e.g., via respective vertical through-vias 132 and metal contacts 131, the latter forming ohmic contacts, i.e., metal-semiconductor contacts. The top metal contacts 137 (that may also act as interconnect wirings) may be provided for lateral current injection in the stack. The surrounding cladding layer 135 need, in that case, be compatible with the integration of metal interconnects for CMOS circuits.

The silicon photonic chip 1 may further include a CMOS-compatible metal heater arranged in thermal communication with the active region 105 of III-V gain materials, for further tuning the cavity wavelength (which is otherwise tuned by suitably choosing the lattice characteristics). For example, a metal heater may extend above the active region 105 (not shown) of an LCO laser for tuning the laser wavelength. The metal heater is typically separated from the active region 105 by an insulating layer (e.g., silica) in that case. In some embodiments, the metal heater may be in thermal communication with the III-V stack forming the active region 105, via any intermediate, thermally conducting element. The thermal heater may, for instance, be integrated within the SOI wafer 120 and possibly be formed out of the initial top Si layer (not visible in FIG. 1).

It should be noted that the electro-optical device 10 may be made CMOS compatible and be embedded in the back-end-of-the-line region of the CMOS-fabricated silicon photonic chip 1, as assumed in FIG. 5. Thus, the electro-optical device 10 may possibly be co-integrated (in the back-end-of-the-line region of the silicon photonic chip 1) with one or more CMOS-fabricated integrated circuits 20 (hereinafter "circuits"). And, for example, the circuits 20 may include transistors configured for driving the electro-optical device 10, as assumed in FIG. 5, where all appropriate contacts for all circuit components 10, 20 are provided in the upper stack 130.

Referring now to FIGS. 6A-6J, a method of fabrication of an electro-optical device 10 as described above (or any chip that includes such a device) is described, according to an embodiment of the present disclosure. Essentially, the method may rely on selectively regrowing the pair of structured, p-doped layer 114 and n-doped layer 112 of III-V semiconductor materials. The selective regrowth may allow a neat separation between the n and p regions to be obtained, which in turn may prevent unwanted recombination and leakage paths, as mentioned above.

The difference in terms of dopant concentration between seed layer 108 (undoped or unintentionally doped) and the n-doped, p-doped layers 112, 114 (intentionally doped) may indicate that the p-doped layer 114 and the n-doped layer 112 were obtained a posteriori by selective regrowth. Incidentally, certain designs as discussed herein may perhaps be impossible to obtain without selective regrowth of InP layers (e.g., n-doped layer 112, p-doped layer 114) around the active region.

In addition, this method may involve usual processing steps such as chemical mechanical polishing (CMP), bonding, wet etching, etc.

In the particular example of FIG. 1, the seed layer 105b is a residual portion of a seed layer as initially used to grow the III-V stack of the active region 105, here assumed to be a multiple quantum well (MQW) stack. The seed layer 108 is the cap layer of the initial deposition (e.g., by MOCVD), which is upside down after bonding and may then act as a seed layer for the contact layers (e.g., n-doped, p-doped layers 112, 114). The seed layers 105b, 108 may be made of InP or another III-V compound material. The p-doped layer 114 and the n-doped layer 112 (lateral, structured layers) may extend essentially parallel to the main plane of the active region 105, i.e., parallel to the plane (x, y). The p-doped layer 114 and the n-doped layer 112 (contact layers) may be assumed to include p- and n-doped InP in the example of FIG. 4. Typically, additional III-V layers are present, on top and bottom of the MQW stack of the active region 105, including separate confinement heterostructures (SCH) 105a, typically comprising InAlGaAs. Thus, the active region of the stack may be sandwiched between SCH layers 105a, which may in fact be considered as forming part of the active region 105. A bonding layer 107 may extend at the interface between the two structured wafer components (i.e., formed by the SOI wafer 120 and cladded component 100, 130). The bonding layer 107 may in fact result from two separately deposited layers. For completeness, the upper components 105, 112, 114, 131, 132 are cladded with, e.g., an oxide layer such as cladding layer 135, which may include $SiO_2$ or $Al_2O_3$, just like the cladding layers 122, 125.

In FIG. 4, symmetric sets of ohmic contacts (metal-semiconductor contacts) may be formed by metal contacts 131, which are themselves joined by vertical through-vias 132 and top metal contacts 137 (that may also act as interconnect wirings). The top metal pads are assumed to be radiofrequency (RF) electrodes in FIG. 1. Note, however, that such RF pads are not necessarily present. They are, in particular, not needed in case of full integration with transistors. In all cases, the contacts are arranged so as to enable lateral current injection in the stack of the active region 105. The ohmic contacts comprise n- and p-type contacts, respectively in contact with the n-doped layer 112 and the p-doped layer 114.

The silicon photonic chip 1 of FIG. 5 similarly involve metal contacts extending in region 130, so as to contact both the electro-optical device 10 and a neighboring circuit component of the circuits 20.

Referring back to the electro-optical device 10 of FIG. 4, the cladding layers 122, 125, 135 may typically include the same material, e.g., $SiO_2$, Sapphire (i.e., crystalline $Al_2O_3$) or amorphous $Al_2O_3$. Preferably yet, the cladding layers 122, 125, 135 may include $SiO_2$. Next, the III-V stack of the active region 105 may include $In_{1-x-y}Al_xGa_yAs$ ($0 \leq x \leq 1$, $0 \leq y \leq 1-x$), as mentioned above. Specifically, a range of materials may thus be contemplated, including InAs, AlAs, InGaAs (e.g., for quantum dots lasers) and InAlGaAs. In particular, InAs quantum dots may be contemplated when using a GaAs substrate. In some embodiments, the III-V stack of the active region 105 may include InGaAsP or InGaAsN. In general, the III-V stack may be configured as an MQW section sandwiched between other III-V materials, e.g. InP, or GaAs, preferably lattice matched to the MQW section to prevent oxidation, as needed to start the growth of the core III-V stacked layers. The III-V stack of the active region 105 may also include quantum dots sandwiched between quantum wells.

Such layer stack may be relatively easy to grow, e.g., by molecular beam epitaxy (MBE) or by metal-organic chemical vapor deposition (MOCVD). The semiconductor materials may be doped, as necessary, and preferably in conjunction with strain, e.g., to tune the bandgap.

In other embodiments, the electro-optical device 10 may be implemented as a nano-laser device, which is further configured to address all of the requirements mentioned above. Namely, in such a nano-laser device, light may be confined in a very small volume (smaller than $\lambda^3$), which allows very low threshold current. Moreover, patterning techniques may allow a very small device (micrometer-scale) to be achieved, so as to enable high-speed and large scale integration. The fact that the cavity may be coupled to an integrated waveguide may allow an efficient extraction and coupling to silicon waveguides. As the cavity wavelength is fixed by the period and filling factor of the p-doped layer 114 and the n-doped layer 112 (photonic crystal layers), the lasing wavelength may be easily tuned. In addition, the very small active region 105 that may be achieved (e.g., by MOCVD) eases the active tuning (e.g., with heaters), if necessary. InGaAlAs quantum wells or dots are preferentially used, owing to their thermal stability. Not only the selective regrowth of the n- and p-regions allows a clean separation to be obtained, but, in addition, this may improve the ohmic contacts and obtain high doping levels. For completeness, 2D monolithic integration may be contemplated in the back-end-of-the-line region of a CMOS chip, using standard processes. A high free spectral range (FSR) may be achieved, in the order of ~20 to 30 nm, which is already sufficient to have only one mode in the gain spectrum. As a result, embodiments of the present disclosure, may provide nano-laser devices suitable for use in wavelength-division multiplexers (WDM).

In some embodiments, the electro-optical device 10 may be bonded onto a SOI wafer, wherein Si waveguide cores are patterned and tapered (terminated by a tip, as in FIG. 1). The electro-optical component may include a slab that includes a pair of structured, doped III-V layers, each configured as a 2D photonic crystal (formed by a lattice of holes). The doped III-V layers are fully separated by a separation section that includes current blocking trenches 106 and an III-V stack in-between, so as to form a photonic crystal cavity (an optical resonator), as discussed above.

The III-V stack may contain InGaAlAs quantum wells or quantum dots, where the side contact regions comprises InP. The slab is bonded to the SOI wafer and embedded in silica. The n- and p-regions are defined on each side of the resonator by selective regrowth. The n-region defines an optical waveguide, which includes a tapered portion protruding from the n-doped layer, which tapered portion is arranged opposite the reversely tapered portion of the Si waveguide core of the SOI wafer. Metal contacts are provided on the III-V slab for current injection. A metal heater is arranged above the active region 105 for tuning the laser wavelength. Still, the metal heater is separated from the active region 105 by an insulating layer made of silica.

By forming the n− and p− regions using selective regrowth may also enable the regrowth of n+ and p+ regions, so as to ensure ohmic contact with the metal electrodes. Additionally, the selective regrowth may enable a strict separation between the n- and p-regions, as mentioned above.

With continued reference to FIGS. 6A-6J, an exemplary fabrication process is described, according to an embodiment of the present disclosure. First, a SOI wafer is provided, FIG. 6A. Second, the top Si layer of the SOI wafer is structured using electron beam lithography (EBL) to shape a resist on top of the top Si layer, followed by inductively coupled plasma (ICP) etching. A tapered Si waveguide core is accordingly obtained, FIG. 6B. Third, after having removed the residual resist portion, plasma-enhanced chemical vapor deposition (PECVD) is used to clad (with silica) the tapered Si waveguide core. The deposited cladding layer is subsequently polished by CMP, FIG. 6C. An III-V wafer is then bonded onto the processed SOI wafer, FIG. 6D. Fifth, the III-V substrate is removed by wet etching of the sacrificial layer grown on the III-V substrate before the active region, FIG. 6E. Next, ICP etching is used to obtain the multiple quantum well (MQW) section sandwiched between other III-V materials, e.g. InP. Seventh, the n- and p-doped regions are selectively regrowth by metal-organic chemical vapor deposition (MOCVD), so as to obtain a clean separation, FIG. 6G. Then, the InP regions are structured by ICP etching, whereby the out-coupling (tapered) waveguide is obtained, FIG. 6H. Next, another PECVD step is performed to clad (with silica) the structured InP layers (including the tapered out-coupling waveguide core). Metal contacts are patterned by a lift-off process, FIG. 6I. Finally, RF electrodes are patterned on top of the underlying contacts, using again a lift-off process.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for fabricating an electro-optical device, the method comprising:
    forming a pair of structured doped layers of III-V semiconductor materials on a slab, the pair of structured doped layers are arranged side-by-side in the slab, the pair of structure doped layers comprising an n-doped layer and a p-doped layer, wherein each of the p-doped layer and the n-doped layer comprises a two-dimensional photonic crystal, the n-doped layer is further structured to form an output waveguide core comprising a tapered portion protruding from an edge of the n-doped layer and extending parallel to an extraction portion of the output waveguide core formed as a line defect in a lattice of holes of the n-doped layer, wherein one or more rows of holes in the lattice of holes are missing at a level of the line defect; and
    forming a separation section extending between the pair of structured doped layers, the separation section separates the pair of structured doped layers, wherein the separation section comprises:
    current blocking trenches, and
    an active region of III-V semiconductor gain materials between the current blocking trenches that form a photonic crystal cavity.

2. The method of claim 1, wherein each of the p-doped layer and the n-doped layer is obtained by selective regrowth.

3. The method of claim 1, wherein the photonic crystal cavity has a cavity frequency within a photonic frequency bandgap of the photonic crystal cavity, and each of the p-doped layer and the n-doped layer comprises a crystal lattice defect on the active region designed to cause, together with the separation section, an optical mode within the photonic frequency bandgap.

4. The method of claim 3, wherein each of the p-doped layer and the n-doped layer comprises a lattice of holes, including a modulated subset of holes that form the crystal lattice defect.

5. The method of claim 4, wherein a width of the separation section, as measured in an average plane of the slab, between the p-doped layer and the n-doped layer, corresponds to an average distance between two holes in the lattice of any of the p-doped layer and the n-doped layer.

6. The method of claim 4, wherein the lattice of holes comprises a hexagonal lattice.

7. The method of claim 1, wherein the output waveguide core is structured for out-coupling optical radiation from the slab.

8. The method of claim 7, wherein the n-doped layer comprises an edge crystal lattice defect about the edge of the n-doped layer, the edge crystal lattice defect designed to lower back-reflection of radiation out-coupled through the output waveguide core.

9. The method of claim 1, wherein the electro-optical device comprises a lateral current injection edge-emitting laser device.

10. The method of claim 1, wherein the III-V semiconductor gain materials comprise one of: $In_{1-x-y}Al_xGa_yAs$; $In_{1-x}Ga_xAs_yP_{1-y}$; or $In_{1-x}Ga_xAs_yNi_{1-y}$, with $0 \leq x \leq 1$ and $0 \leq y \leq 1-x$, and each of the p-doped layer and the n-doped layer comprises one of InP, InAs or GaAs.

* * * * *